(12) United States Patent
Saito et al.

(10) Patent No.: US 10,276,474 B2
(45) Date of Patent: Apr. 30, 2019

(54) SEMICONDUCTOR DEVICE

(71) Applicant: FUJI ELECTRIC CO., LTD., Kawasaki-shi (JP)

(72) Inventors: Takashi Saito, Matsumoto (JP); Ryoichi Kato, Matsumoto (JP); Yoshitaka Nishimura, Azumino (JP); Fumihiko Momose, Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/091,957

(22) Filed: Apr. 6, 2016

(65) Prior Publication Data
US 2016/0225688 A1 Aug. 4, 2016

Related U.S. Application Data

(63) Continuation of application No. PCT/JP2015/054784, filed on Feb. 20, 2015.

(30) Foreign Application Priority Data

Mar. 20, 2014 (JP) .................. 2014-059220

(51) Int. Cl.
*H01L 23/367* (2006.01)
*H01L 21/48* (2006.01)
(Continued)

(52) U.S. Cl.
CPC ........ *H01L 23/367* (2013.01); *H01L 21/4875* (2013.01); *H01L 21/4882* (2013.01);
(Continued)

(58) Field of Classification Search
None
See application file for complete search history.

(56) References Cited

U.S. PATENT DOCUMENTS

| 5,134,463 A | 7/1992 | Yamaguchi |
| 5,707,715 A | 1/1998 | deRochemont et al. |

(Continued)

FOREIGN PATENT DOCUMENTS

| CN | 101341592 A | 1/2009 |
| CN | 102751249 A | 10/2012 |

(Continued)

OTHER PUBLICATIONS

PCT, "International Search Report for International Application No. PCT/JP2015/054784".

(Continued)

*Primary Examiner* — Walter H Swanson
*Assistant Examiner* — Kien C Ly
(74) *Attorney, Agent, or Firm* — Manabu Kanesaka

(57) ABSTRACT

A semiconductor device includes a plurality of semiconductor elements; insulating circuit boards each including an insulating substrate, a circuit portion on a front surface of the insulating substrate connected to one semiconductor element, and a metal portion on a rear surface of the insulating substrate; a metal plate joined to the metal portions of the plurality of insulating circuit boards; and a joint member joining the plurality of insulating circuit boards to the metal plate. The metal plate has a front surface in which the insulating circuit boards are arranged apart from each other, and a rear surface including first regions corresponding to positions of the metal portions and second regions other than the first regions. At least a part of a surface of each of the first regions has a surface work-hardened layer, and the second regions have a hardness different from that of the surface work-hardened layer.

11 Claims, 14 Drawing Sheets

(51) Int. Cl.
  *H01L 23/498* (2006.01)
  *H01L 23/373* (2006.01)
  *H01L 23/40* (2006.01)
  *H01L 23/00* (2006.01)
  *H01L 25/07* (2006.01)

(52) U.S. Cl.
  CPC .... *H01L 23/3735* (2013.01); *H01L 23/49838* (2013.01); *H01L 23/49861* (2013.01); *H01L 23/49894* (2013.01); *H01L 23/4006* (2013.01); *H01L 24/29* (2013.01); *H01L 24/32* (2013.01); *H01L 24/48* (2013.01); *H01L 24/73* (2013.01); *H01L 25/072* (2013.01); *H01L 2224/291* (2013.01); *H01L 2224/32225* (2013.01); *H01L 2224/4846* (2013.01); *H01L 2224/48227* (2013.01); *H01L 2224/73265* (2013.01); *H01L 2924/00014* (2013.01); *H01L 2924/1203* (2013.01); *H01L 2924/13055* (2013.01); *H01L 2924/13091* (2013.01); *H01L 2924/19107* (2013.01); *H01L 2924/3511* (2013.01)

(56) References Cited

U.S. PATENT DOCUMENTS

| | | | |
|---|---|---|---|
| 7,923,833 B2 | 4/2011 | Furukawa et al. | |
| 8,995,129 B2 | 3/2015 | Iwata et al. | |
| 9,741,668 B2 * | 8/2017 | Kim | H01L 23/562 |
| 2004/0144561 A1 | 7/2004 | Osanai et al. | |
| 2008/0079145 A1 * | 4/2008 | Tschirbs | H01L 23/3735 257/706 |
| 2010/0302741 A1 * | 12/2010 | Kanschat | H01L 23/24 361/717 |
| 2011/0024786 A1 * | 2/2011 | Sugiyama | H01L 33/486 257/99 |
| 2014/0035123 A1 * | 2/2014 | Oka | H01L 23/367 257/712 |
| 2016/0027709 A1 * | 1/2016 | Okamoto | H01L 23/08 257/693 |
| 2016/0284664 A1 * | 9/2016 | Hohlfeld | C04B 37/00 |

FOREIGN PATENT DOCUMENTS

| | | | |
|---|---|---|---|
| EP | 0424858 A2 | | 5/1991 |
| JP | H10-087385 A | | 4/1998 |
| JP | 2000-281462 A | | 10/2000 |
| JP | 2004-214284 A | | 7/2004 |
| JP | 2006-332084 A | | 12/2006 |
| JP | 2006332084 A | * | 12/2006 |
| JP | 3971296 B2 | | 6/2007 |

OTHER PUBLICATIONS

China Patent Office, "Office Action for Chinese Patent Application No. 201580002155.1," dated Nov. 27, 2017.

* cited by examiner

SEMICONDUCTOR DEVICE

CROSS-REFERENCE TO RELATED APPLICATIONS

This is a continuation application of PCT/JP2015/054784 filed on Feb. 20, 2015, claiming a priority of Japanese Patent Application No. 2014-059220 filed on Mar. 20, 2014, the disclosure of which is incorporated herein.

TECHNICAL FIELD

The present invention relates to a semiconductor device such as the one equipped in a power converter.

BACKGROUND ART

FIG. 6 shows a cross-sectional diagram of a conventional semiconductor device. A semiconductor chip 6 equipped in this semiconductor device is an IGBT (Insulated Gate Bipolar Transistor), MOSFET (MOS-type Field Effect Transistor), FWD (freewheeling diode), or the like. The semiconductor device equipped with an IGBT is hereinafter referred to as "IGBT device." The semiconductor device is described below with an IGBT device as an example.

When joining an insulating circuit board 4 (a DCB board: Direct Copper Bonding board) and a metal plate 3 by solder 5 in order to assemble the IGBT device, the great difference in linear expansion coefficient between the insulating circuit board 4 and the metal plate 3 inevitably causes a phenomenon where the flat metal plate prior to the soldering process as shown in FIG. 7(a) becomes shaped into a concave curve in which the center of the rear surface of the metal plate 3 on the side opposite to the soldered insulating circuit board 4 forms the bottom after the soldering process, as shown in FIG. 7(b). Such phenomenon occurs because, as a result of joining the principal surfaces of the insulating circuit board 4 having a low linear expansion coefficient (the linear expansion coefficient of a ceramic substrate: 4.6 to 7.3×10$^{-6}$K$^{-1}$) and the metal plate 3 having a large linear expansion coefficient (the linear expansion coefficient of copper: 16.6×10$^{-6}$K$^{-1}$) to each other by the solder 5 at high temperature, the resultant IGBT device bends toward the side with a large linear expansion coefficient when the temperature returns to the room temperature.

In view of the problems associated with this warpage of the metal plate of a semiconductor device, Patent Literature 1 discloses a method for leveling the concaved metal plate by performing a shot-peening process on the rear surface of the metal plate located on the side opposite to the surface to which an insulating circuit board is joined.

Further, Patent Literature 2 describes a method for preventing the rear surface of the metal plate from warping significantly into a concave curve even when heated to be soldered, by forming a metal-ceramic joint substrate in which a metal circuit board is joined to one side of a ceramic substrate, one side of a heat sink is joined to the other side of the ceramic substrate, and a work-hardened layer is formed on the other side of the heat sink.

CITATION LIST

Patent Literature

PATENT LITERATURE 1: Japanese Patent Application Laid-open No. 2006-332084 (abstract, claim 1, FIG. 6)

PATENT LITERATURE 2: Japanese Patent Application No. 3971296 (paragraph 0011, FIGS. 1 to 3)

SUMMARY OF INVENTION

Technical Problem

As described above, the metal plate of a semiconductor device is likely to warp due to the difference in linear expansion coefficient between the assembled parts. When attaching such a semiconductor device having a concaved metal plate onto a flat surface of a cooler by using thermal grease, the warpage of the metal plate, such as the one shown in FIG. 7(b), leads to generation of a gap between the vicinity of the center of the metal plate and the surface of the cooler. This gap, which is a result of the warpage of the metal plate (referred to as "concave warpage" or "negative warpage"), cannot be eliminated easily even after inserting bolts into the holes provided around the metal plate and tightening the bolts, resulting in a deterioration of heat dissipation of the semiconductor device.

There is also known a method for preventing such negative warpage of the metal plate of a semiconductor device by creating positive warpage, opposite of the negative warpage, as the initial warpage in the metal plate in advance as shown in FIG. 7(c), and then leveling the metal plate or making small positive warpage in the metal plate after the soldering process, as shown in FIG. 7(d). One of the problems with this positive warpage correction method shown in FIGS. 7(c) and 7(d) is that the use of an initially-warped metal plate creates a gap between the metal plate and insulating circuit boards, reducing the possibility of obtaining a good-quality soldering result.

Due to a demand in the market for small, light semiconductor devices with excellent heat dissipation characteristics, the insulating substrate mainly made of aluminum nitride or silicon nitride will be used frequently. However, due to its better thermal conductivity and lower linear expansion coefficient compared to the conventional alumina insulating substrate, the great difference in linear expansion coefficient between this insulating substrate and a metal plate is likely to enhance the warpage of the metal plate.

The inventors have found a yet-to-be-discovered technical problem that complex warpage is caused in a semiconductor device having a plurality of insulating circuit boards soldered together, whereas the entire metal plate curves as a single plate in a semiconductor device in which a single insulating circuit board is soldered to one side of the metal plate. For example, FIG. 8(a) shows rear surface regions (4a to 4f) of the metal plate 3 in which a plurality of insulating circuit boards is arranged, and FIG. 8(b) shows the metal plate 3 with dotted lines, wherein the degree of warpage of the metal plate 3 is shown with a contour. As shown in these diagrams, local warpage is generated at each of the regions where the plurality of insulating circuit boards is arranged.

The phenomenon that causes warpage of the entire metal plate and the local concave curves therein with respect to the insulating circuit boards, not only inhibits the thermal grease from spreading but also creates a portion where the thermal grease is thick, resulting in a deterioration of heat dissipation.

An object of the present invention, therefore, is to provide a semiconductor device that is designed to reduce warpage of its entire metal plate to be joined to a cooler and local warpage that is generated by joining a plurality of insulating circuit boards, and a method for manufacturing this semiconductor device.

Solution to Problem

In order to accomplish this object, a semiconductor device according to the present invention includes: a plurality of insulating circuit boards each including an insulating substrate, a circuit portion connected to a semiconductor element on a front surface of the insulating substrate, and a metal portion on a rear surface of the insulating substrate; a metal plate that is larger than the insulating circuit boards and joined to the metal portions of the plurality of insulating circuit boards; and a joint member for joining the insulating circuit boards to the metal plate. The metal plate has the insulating circuit boards arranged apart from each other on a front surface thereof, and has first regions corresponding to the positions of the metal portions and second regions other than the first regions on a rear surface thereof, at least a part of a surface of each of the first regions has a surface work-hardened layer, and the second regions have a hardness different from that of the surface work-hardened layer.

According to the present invention, the surface work-hardened layer is formed in at least a part of each of first regions corresponding to the positions of the plurality of insulating circuit boards of the metal plate. Therefore, not only is it possible to prevent warpage of the entire metal plate, but also local negative warpage of the metal plate can be inhibited, narrowing the gap between the metal plate and the cooler and improving the heat dissipation of the semiconductor device.

In the semiconductor device according to the present invention, it is preferred that the surface work-hardened layer extend across a plurality of the first regions.

In the semiconductor device according to the present invention, it is preferred that a direction in which the surface work-hardened layer extends across the plurality of first regions be a direction in which a width of the metal plate is short.

According to the foregoing aspect, a surface work-hardened layer with a simple pattern that includes the plurality of first regions can be formed.

In the semiconductor device according to the present invention, it is preferred the degree of warpage of the first regions be 50 µm or less. The degree of warpage here means the difference in height between the center of the curved surface and the edges thereof.

According to the foregoing aspect, not only is it possible to prevent local warpage of each first region, but also the gap between the metal plate and the cooler can be narrowed, improving the heat dissipation of the semiconductor device.

In the semiconductor device according to the present invention, it is preferred that an area of the surface work-hardened layer in each of the first regions be equal to or greater than 30% of an area of the first region.

According to the foregoing aspect, the degree of local warpage of the first regions can be reduced to 50 µm or less.

In the semiconductor device according to the present invention, it is preferred that the insulating substrate be mainly made of aluminum oxide, aluminum nitride, or silicon nitride.

According to the foregoing aspect, even with a small radiation area, sufficient heat can be released by improving the thermal conductivity of the insulating substrates, resulting in a reduction in size of the device.

In the semiconductor device according to the present invention, it is preferred that the metal plate be a heat sink for cooling the semiconductor element.

In a method for manufacturing a semiconductor device according to the present invention, a semiconductor device includes: a plurality of insulating circuit boards each including an insulating substrate, a circuit portion connected to a semiconductor element on a front surface of the insulating substrate, and a metal portion on a rear surface of the insulating substrate; a metal plate that is larger than the insulating circuit boards, has the insulating circuit boards arranged apart from each other on a front surface thereof, and has first regions corresponding to the positions of the metal portions and second regions other than the first regions on a rear surface thereof; and a joint member joining the insulating circuit boards to the metal plate. The method includes the steps of: forming a mask on the rear surface of the metal plate, except for at least a part of each of the first regions; and performing a shot-peening process to form a surface work-hardened layer in regions of the first regions where the mask is not formed.

According to the present invention, the surface work-hardened layer is formed in at least a part of each of the first regions. Therefore, not only is it possible to inhibit local negative warpage of the metal plate, but also the gap between the metal plate and the cooler can be narrowed, improving the heat dissipation of the semiconductor device.

It is preferred that the method for manufacturing a semiconductor device according to the present invention further has a step of performing a heating process for heating the semiconductor device after forming the surface work-hardened layer.

According to the foregoing aspect, chronological changes in the degree of warpage of the metal plate during use of the semiconductor device can be prevented.

In the method for manufacturing a semiconductor device according to the present invention, it is preferred that the heating process be performed at a temperature equal to or higher than 60° C. but equal to or lower than 175° C.

According to the foregoing aspect, chronological changes in the degree of warpage of the metal plate can effectively be prevented in the semiconductor device that is used at a temperature equal to or higher than 60° C. but equal to or lower than 175° C.

In the method for manufacturing a semiconductor device according to the present invention, it is preferred that a cooling process be performed subsequent to the heating process and that the heating process and the cooling process be repeated alternately.

In the method for manufacturing a semiconductor device according to the present invention, it is preferred that the number of cycles in which the heating process and the cooling process are performed be one or more.

In the method for manufacturing a semiconductor device according to the present invention, it is preferred that the heating process be performed at 150° C. and that the cooling process be performed at −40° C.

Advantageous Effects of Invention

According to the present invention, the surface work-hardened layer is formed in at least a part of each of the first regions corresponding to the positions of the plurality of insulating circuit boards of the metal plate. Therefore, not only is it possible to prevent warpage of the entire metal plate, but also local negative warpage of the metal plate can be inhibited, narrowing the gap between the metal plate and the cooler and improving the heat dissipation of the semiconductor device.

DESCRIPTION OF EMBODIMENTS

Figure 1:
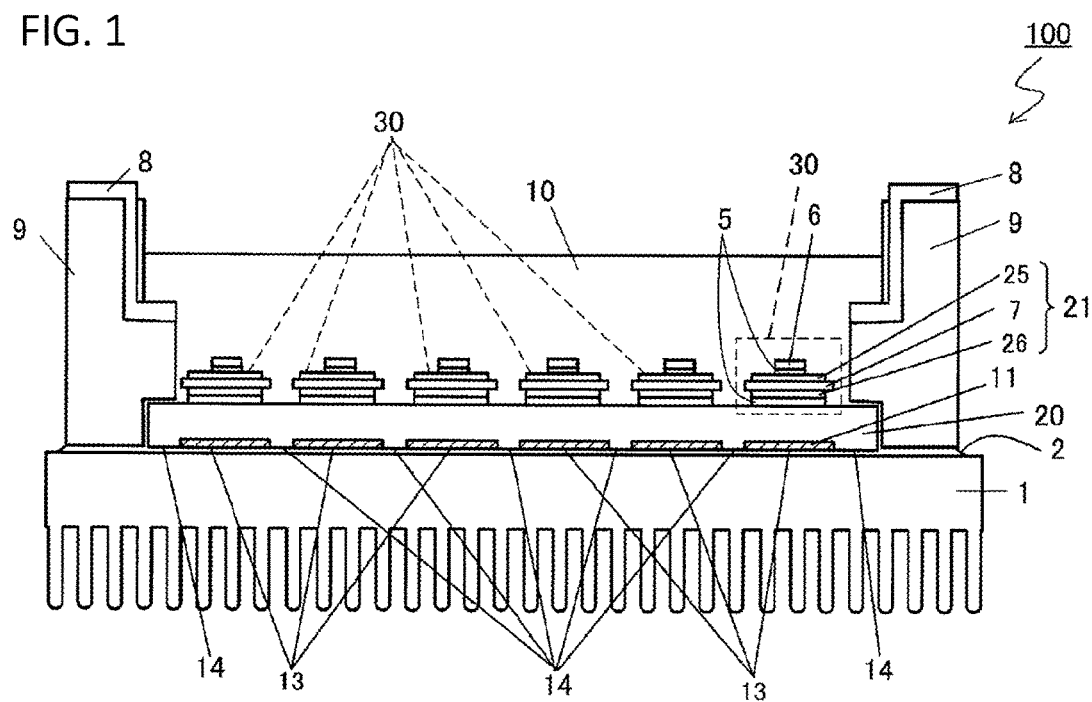
FIG. 1 is a schematic cross-sectional diagram showing an embodiment of a semiconductor device according to the present invention.

An embodiment of a semiconductor device according to the present invention is now described hereinafter in detail with reference to the drawings. In the following descriptions of the embodiment and accompanying drawings, the same reference numerals are used to describe the same components; thus, the overlapping descriptions are omitted accordingly. The accompanying drawings provided in the following descriptions are not in the accurate scales or proportions for the purpose of easy visibility and understanding. In addition, the present invention is not limited to the following descriptions of the embodiment unless they exceed the gist of the present invention.

The embodiment of the semiconductor device according to the present invention is described with reference to the drawings.

FIG. 1 is a cross-sectional diagram schematically showing the semiconductor device of the present invention attached to a cooler 1. The semiconductor device 100 is attached to the cooler 1 with thermal grease 2 therebetween. The semiconductor device 100 includes a metal plate 20, semiconductor device structures 30, an external terminal 8, and a terminal case 9 accommodating these elements, wherein the terminal case 9 is filled with sealing resin 10.

The semiconductor device structures 30 each includes a semiconductor chip 6, such as an IGBT, MOSFET or FWD, and an insulating circuit board 21 in which a circuit portion 25 is disposed on a front surface of an insulating substrate 7 and a metal portion 26 is disposed on a rear surface of the same. A rear surface of the semiconductor chip 6 is joined to the circuit portion 25 of the insulating circuit board 21 by solder 5. The electrode provided on the front surface side of the semiconductor chip 6 is electrically connected to the external terminal 8 by a bonding wire, not shown. It is preferred that the insulating substrate 7 be made of a material with excellent heat conduction, such as aluminum oxide, aluminum nitride, or silicon nitride. Preferably, the circuit portion 25 and the metal portion 26 are made primarily of a metal with good electric conductivity, such as a copper plate or copper foil.

The plurality of semiconductor device structures 30 is arranged apart from each other on the metal plate 20, in which the metal portions 26 of the respective insulating circuit boards 21 are soldered to the metal plate 20.

The positions of the semiconductor device structures 30 are not particularly limited. Although in FIG. 1, six semiconductor device structures 30 are arranged in a row at intervals, the metal portions 26 of the respective insulating circuit boards 21 can be arranged in two rows, with three metal portions 26 in each row, for example. When there are more semiconductor device structures, the semiconductor device structures can be arranged in a different manner. The insulating circuit boards 21 forming the semiconductor device structures 30 do not all have to be in the same shape, and some of the insulating circuit boards 21 may be in a continuous form. The continuous insulating circuit boards 21 can also have the semiconductor device structures 30 arranged in the short direction of the metal plate 20.

On a rear surface of the metal plate 20 (the side opposite to the surface on which the insulating circuit boards 21 are arranged, or the side contacting the cooler 1), first regions 13 represent the regions corresponding to the positions of the metal portions 26 of the respective insulating circuit boards 21, and second regions 14 represent the regions other than the first regions 13.

In the semiconductor device 100 of the present invention, a surface work-hardened layer 11 is formed in at least a part of each of the first regions 13, and the hardness of the second regions 14 is different from that of the surface work-hardened layers 11. One of the effects of the surface work-hardened layers 11 is to reduce local negative warpage of the first regions 13. The method for forming the surface work-hardened layers 11 is not particularly limited; thus, the surface work-hardened layers 11 can be formed by means of, for example, a shot-peening process or the like, described hereinafter.

As shown in FIG. 1, the surface work-hardened layers 11 have the same shape and size as the first regions 13. In another aspect, however, the surface work-hardened layers 11 may be formed partially on the insides of the first regions 13. In yet another aspect, the surface work-hardened layers 11 may be formed in such a manner as to extend across a plurality of the first regions 13. For instance, within the acceptable range of warpage, a region for forming a surface work-hardened layer 11 may have a simplified pattern that includes a plurality of first regions 13. Because warpage is small in the direction in which the width of the metal plate 20 is short, the direction in which the surface work-hardened layers 11 extend across the first regions 13 is preferably the same as the direction in which the width of the metal plate 20 is short.

From the perspective of heat dissipation, it is preferred that the level of local warpage of each of the first regions 13 in the metal plate 20 (the difference in height between the center of the curved surface and the edges thereof) be 50 μm or less. Therefore, the area of each of the surface work-hardened layers 11 in the first regions 13 is preferably equal to or greater than 30% of the area of each of the first regions 13.

An embodiment of a method for manufacturing the semiconductor device 100 according to the present invention is described next with reference to the drawings.

Figure 5:
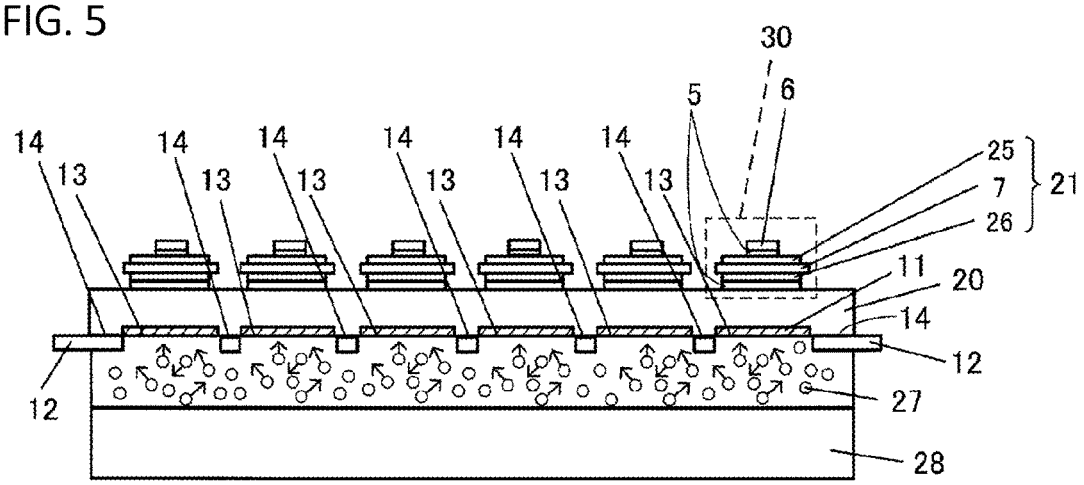
FIG. 5 is a schematic cross-sectional diagram for explaining a shot-peening process according to the present invention.
Figure 6:
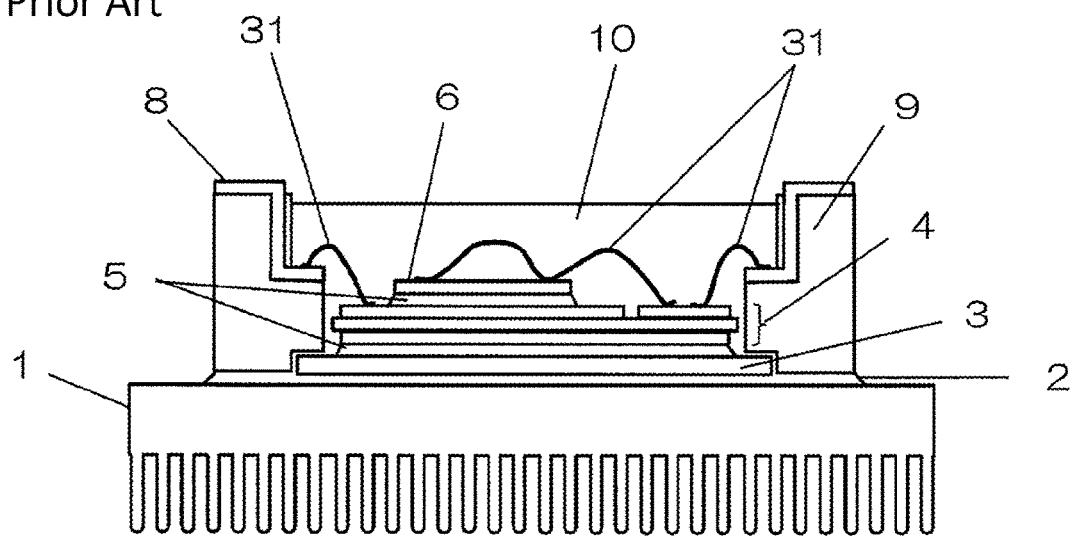
FIG. 6 is a cross-sectional diagram of a general semiconductor device.
Figure 7A:
FIGS. 7(a)-7(d) are schematic cross-sectional diagrams for explaining warpage of the metal plate of the semiconductor device.
Figure 7B:
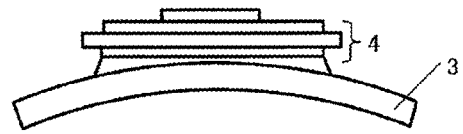
Figure 7C:
Figure 7D:
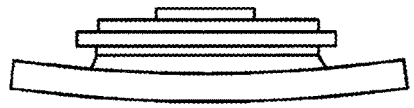

FIG. 5 schematically shows a cross section of the semiconductor device in which a shot-peening process is performed in order to form the surface work-hardened layers 11 in the first regions 13 of the metal plate 20.

In the present invention, the plurality of insulating circuit boards 21 is arranged on the flat metal plate 20 that is not yet subjected to a warping process, and then the semiconductor chips 6, the respective insulating circuit boards 21, and the metal plate 20 are connected together by the solder 5. Subsequently, the semiconductor chips 6 are bonded to one another by wires, and the semiconductor chips 6 and an external terminal (not shown) are also bonded to each other by wires. The resultant product is then stored in a terminal case (not shown), which is then filled with sealing resin (not shown), completing a semiconductor module. Thereafter, the region that is not treated is covered with a mask 12 so that the surface work-hardened layers 11 can selectively be formed on the surface of the metal plate 20. The material of the mask is not particularly limited. For example, a resist mask or a metal mask can be used.

FIG. 5 shows a method pertaining to the shot-peening process, in which a shot material 27 that is applied with kinetic energy by an ultrasonic vibration device 28 is strongly projected onto the unmasked, exposed surface of the metal plate and then the surface layer is compressed, to form the surface work-hardened layers 11 in each of which residual stress of compression is retained. The shot material 27 is not particularly limited, and metal particles, ceramic particles, glass particles or the like having an average particle diameter of, for example, 1 to 3 mm can be used. The method for applying kinetic energy to the shot material 27 is not particularly limited, and other than the ultrasonic vibration device, a method for spraying a mixture of pressure airflow and the shot material 27 may be used.

As a result of the shot-peening process, the surface work-hardened layers 11 having a thickness of several μm to several hundred μm are formed on a lower surface of the metal plate 20. The compressive stress that triggers the surface work-hardened layers 11 to curve into a convex curve is generated in accordance with the difference in hardness between the formed surface work-hardened layers 11 and the inside of the metal plate 20. Consequently, the entire metal plate 20 deforms into positive warpage, reducing local negative warpage of each of the first regions 13.

One of the differences with a conventional shot-peening process is that the shot-peening process of the embodiment uses the mask 12 to form the surface work-hardened layers 11 selectively and at least partially in the first regions 13 instead of performing the shot-peening process on the entire surface of the metal plate 20. Simply performing the shot-peening process on the entire surface of the metal plate 20 cannot improve the negative warpage of the first regions 13 corresponding to the insulating circuit boards 21. This is because performing the shot-peening process on the entire surface causes the local unevenness of the metal plate 20 to warp in the same direction by the same level.

In the method for manufacturing a semiconductor device according to the present invention, the shot-peening process is performed selectively in order to reduce the local negative warpage of the locations where the insulating circuit boards 21 are disposed. Therefore, the metal plate 20 does not need to be deformed into positive warpage beforehand, as is performed in the prior art. The use of the metal plate 20 made of copper that is not warped beforehand can lead to improvement of the possibility of obtaining a good-quality soldering result.

The method for manufacturing a semiconductor device according to the present invention can include a process of heating the semiconductor device subsequent to the process of forming the surface work-hardened layers 11 on the metal plate 20. Thus, the method for manufacturing a semiconductor device according to the present invention can relax the stress of the soldered joints and prevent the chronological changes in the degree of warpage of the metal plate during use of the semiconductor device.

It is preferred that the heating process mentioned above be performed at a temperature at which the solder does not melt and that the heating temperature be equal to or higher than 60° C. but equal to or lower than 175° C. This temperature range can effectively prevent the chronological changes in the degree of warpage of the metal plate 20.

The heating process may be a heating process for keeping the temperature of the semiconductor device at a constant temperature or a heating/cooling process in which the heating process and cooling process are repeated alternately. The heating/cooling process is preferably repeated until the degree of warpage of the metal plate 20 becomes saturated.

According to this manufacturing method of the present invention described above, because the warpage of the metal plate can be controlled significantly to the positive warpage, insulating circuit boards with insulating substrates that are mainly made of aluminum nitride or silicon nitride can be employed. These insulating circuit boards have a lower linear expansion coefficient than the insulating circuit boards with insulating substrates mainly made of alumina, but have better thermal conductivity. Therefore, the size and weight of the semiconductor device can be reduced. In addition, by controlling the warpage of the metal plate to the positive warpage and reducing the negative warpage of the regions on the opposite side of the metal plate that correspond to the positions within the plurality of insulating circuit boards, wettability and expandability of the thermal grease can be improved, resulting in a further reduction in the thickness of the thermal grease and improvement of the heat dissipation.

EXAMPLES

The effects of the shot-peening process used in the present invention are now described in more detail.

Example 1

Figure 2B:
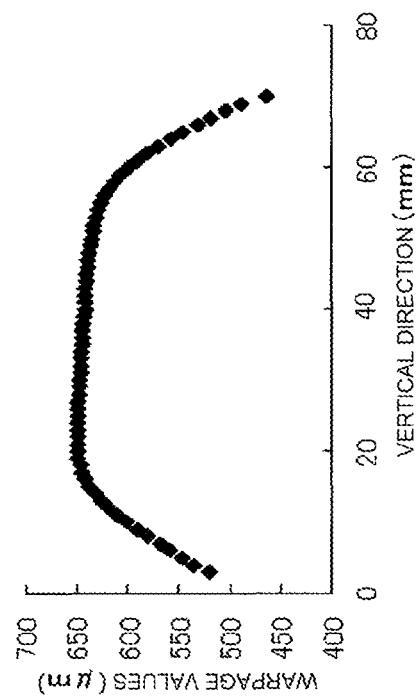
FIGS. 2(a), 2(b) are diagrams showing an example of a distribution of warpage values of a metal plate of the semiconductor device according to the present invention.
Figure 2A:
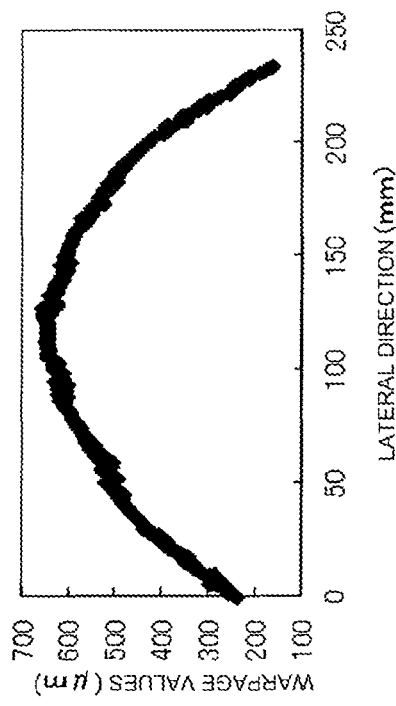
Figure 3:
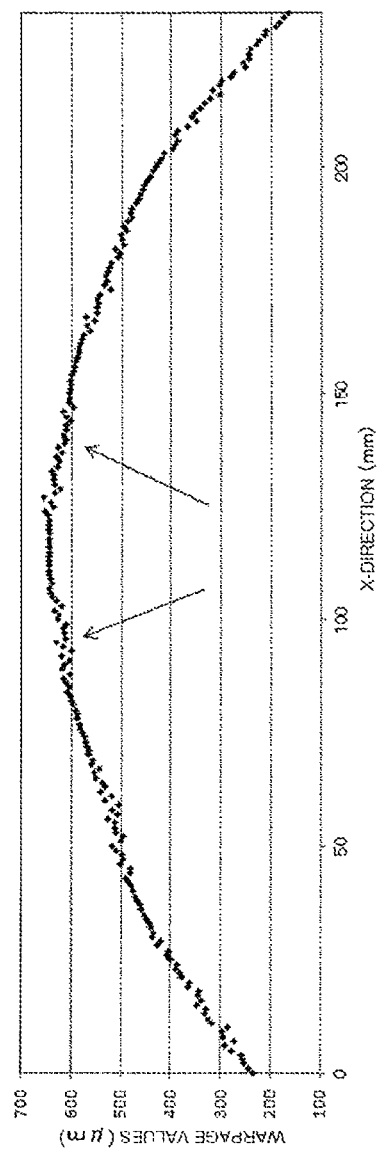
FIG. 3 is an enlarged view of FIG. 2(a)
Figure 4A:
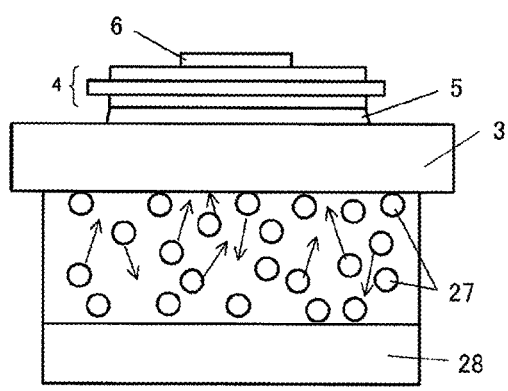
FIGS. 4(a), 4(b) are schematic cross-sectional diagrams for explaining a shot-peening process according to the prior art.
Figure 4B:
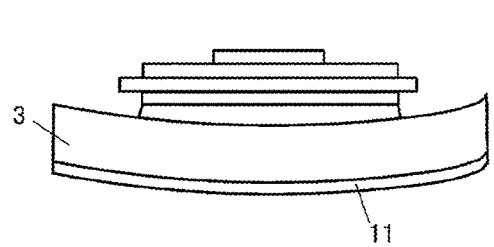
Figure 8A:
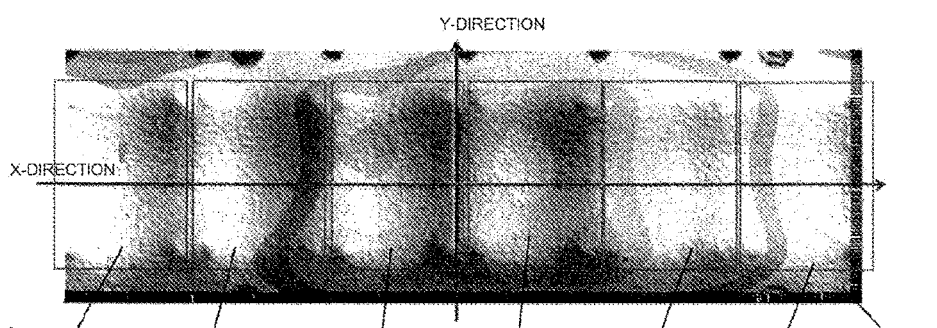
FIGS. 8(a), 8(b) are contour diagrams showing an example of warpage of a metal plate of a semiconductor device according to the prior art.
Figure 8B:
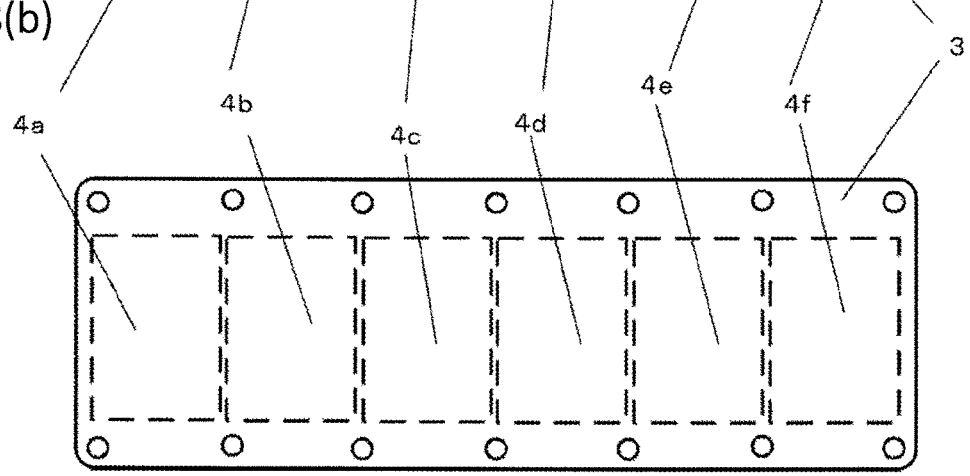

A test sample was prepared in which six insulating circuit boards 21 were arranged on the metal plate 20 made of copper, as shown in FIG. 5 (as shown planarly in FIG. 8(b)). Subsequently, regions other than the first regions 13 corresponding to the insulating circuit boards 21 were covered with a resist mask and subjected selectively to the shot-peening process. Thereafter, the warpage values were measured using a 3D laser displacement meter. The degree of longitudinal warpage shown in FIG. 2(a) (the difference in height between the center of the curved surface and the edges thereof) shows a degree of overall positive warpage of 500 μm, in which the local warpage caused by the insulating circuit boards 21 were almost all eliminated. The warpage in the short direction shown in FIG. 2(b) shows a degree of overall positive warpage of 200 μm, in which there were no local warpage caused by the insulating circuit boards 21. FIG. 3 is an enlarged view of FIG. 2(a).

Comparative Example 1

Figure 9B:
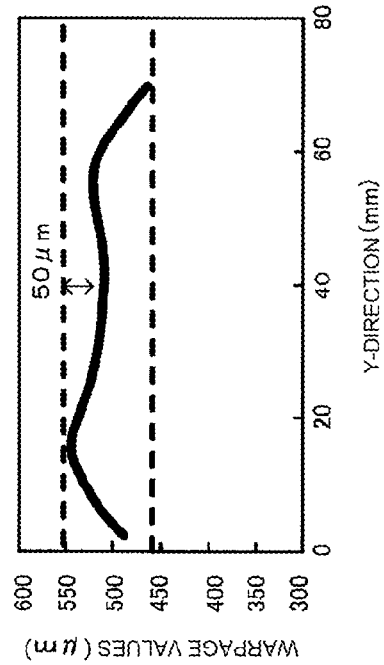
FIGS. 9(a), 9(b) are diagrams showing an example of a distribution of warpage values of a metal plate according to the prior art.
Figure 9A:
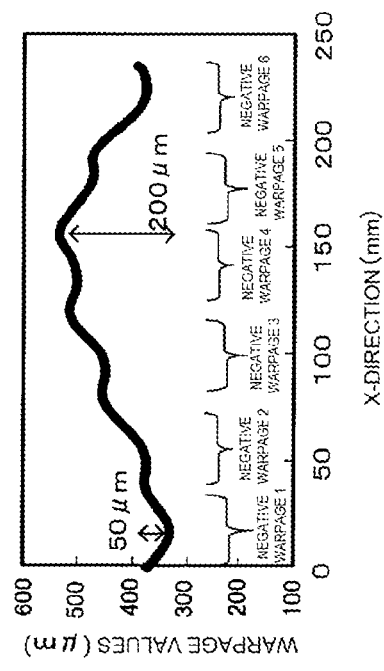
Figure 10:
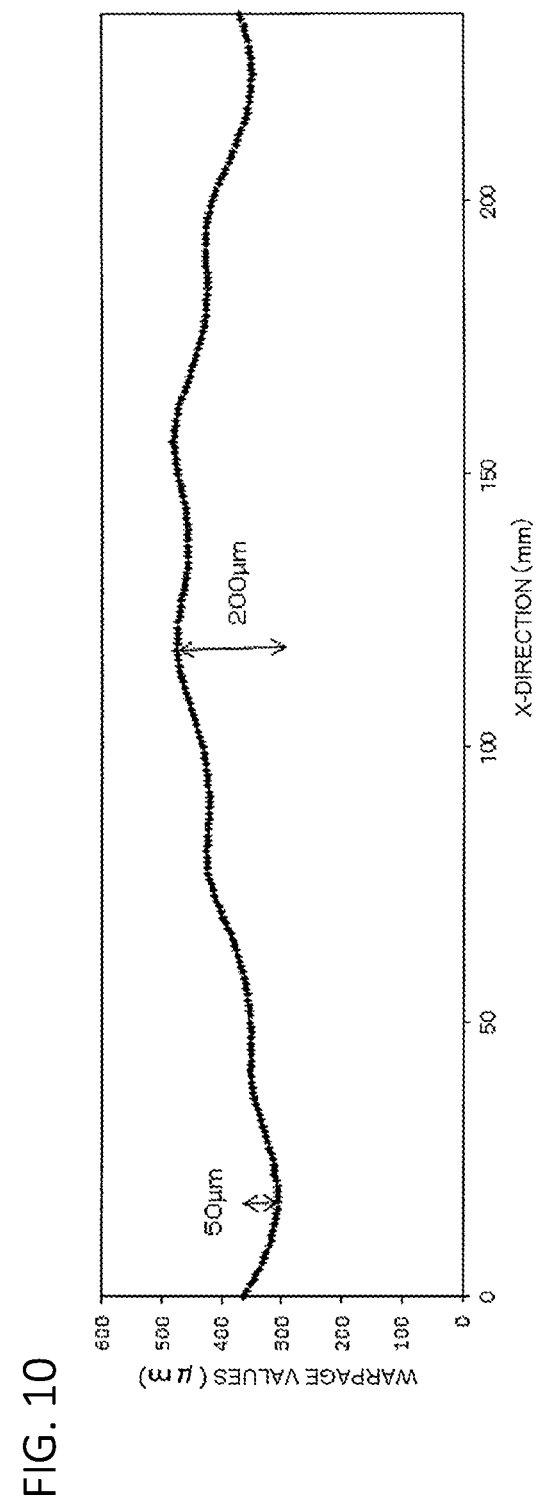
FIG. 10 is an enlarged view of FIG. 9(a)

A test sample was prepared in the same procedure as Example 1, in which the warpage values were measured using the 3D laser displacement meter without executing the shot-peening process. The longitudinal warpage shown in FIG. 9(a) shows a degree of overall positive warpage of approximately 200 μm, in which a degree of local negative warpage of approximately 50 μm was generated due to the insulating circuit boards 21. The warpage in the short direction shown in FIG. 9(b), on the other hand, shows a degree of overall positive warpage of approximately 100 μm, in which a degree of local negative warpage of approximately 50 μm was generated due to the insulating circuit boards 21. FIG. 10 is an enlarged view of FIG. 9(a).

Comparative Example 2

Figure 11A:
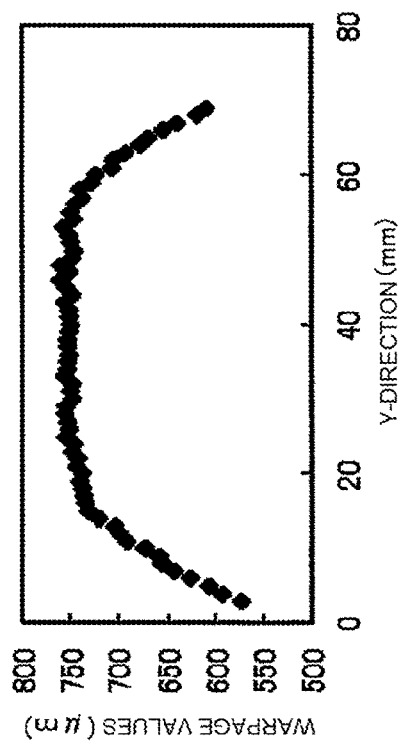
FIGS. 11(a), 11(b) are diagrams showing another example of the distribution of warpage values of the metal plate according to the prior art.
Figure 11B:
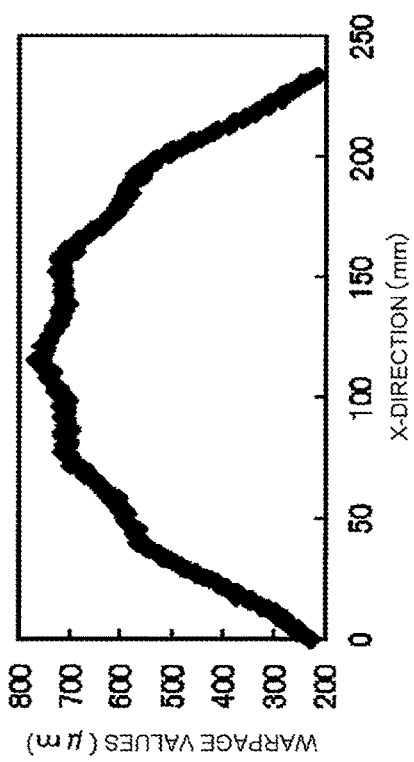
Figure 12:
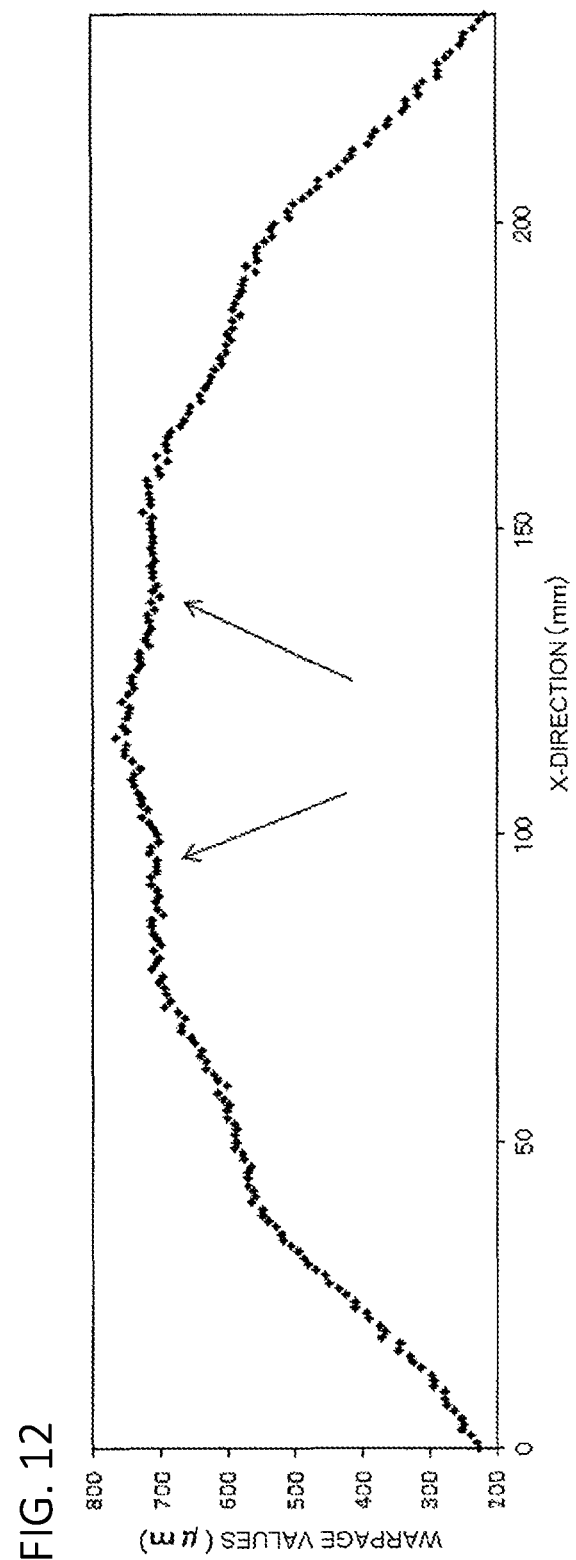
FIG. 12 is an enlarged view of FIG. 11(a)

A test sample was prepared in the same procedure as Example 1, in which the warpage values were measured using the 3D laser displacement meter after performing the shot-peening process on the entire surface of the metal plate 20. The longitudinal warpage shown in FIG. 11(a) shows a degree of overall positive warpage of approximately 600 μm, in which a degree of local negative warpage of approximately 30 μm was generated due to the insulating circuit boards 21. The warpage in the short direction shown in FIG. 11(b) shows a degree of overall positive warpage of 200 μm, in which no local warpage was generated due to the insulating circuit boards 21. FIG. 12 is an enlarged view of FIG. 11(a).

In the past, as described above, because the shot-peening process was performed over the entire surface of the metal plate 20, only approximately half of the local negative warpage corresponding to the insulating circuit boards 21 was improved as compared to when the shot-peening process was not performed at all. The selective shot-peening process performed in the present invention can eliminate almost entire local negative warpage. According to the present invention, the overall positive warpage might be enhanced but it is not a problem because the four corners of the metal plate 20 can be tightly attached to the cooler 1 with bolts.

Warpage Stabilization with the Heating Process

Figure 13:
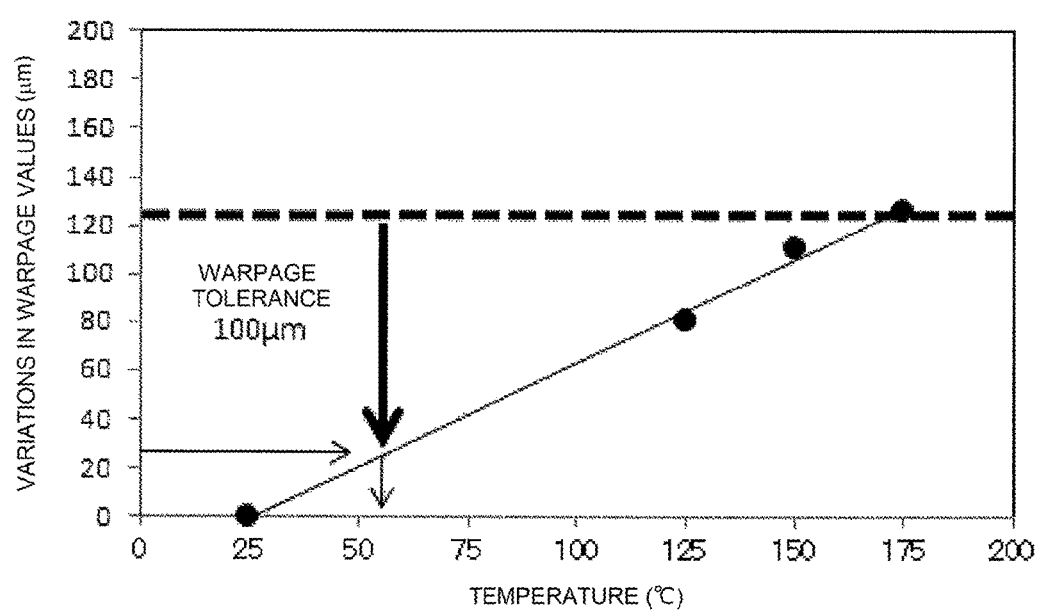
FIG. 13 is a diagram showing variations in the warpage values with respect to the heating temperatures used in a heating test on the semiconductor device according to the present invention.

FIG. 13 is a diagram showing variations in the warpage values of the metal plate 20 with respect to the temperatures, the variations being obtained when the heating temperature is returned to room temperature (25° C.) once after the heating process is performed. The heating process was performed for one hour. Each warpage value variation is the difference between the value obtained by subtracting the minimum warpage value of the metal plate 20 at the room temperature (25° C.) from the maximum warpage value of the same and the value obtained by subtracting the minimum warpage value from the maximum warpage value at each temperature (125° C., 150° C., 175° C.). With a tolerance of the warpage value variations being equal to or less than 100 μm based on the warpage value variation at 175° C., which is the maximum operating temperature of the semiconductor device, the increases of the warpage values of the metal plate 20 after the activation of the semiconductor device can be kept within the acceptable range by performing the heat process within the temperature range of 60° C. to 175° C.

Warpage Stabilization with the Heating/Cooling Process

Figure 14:
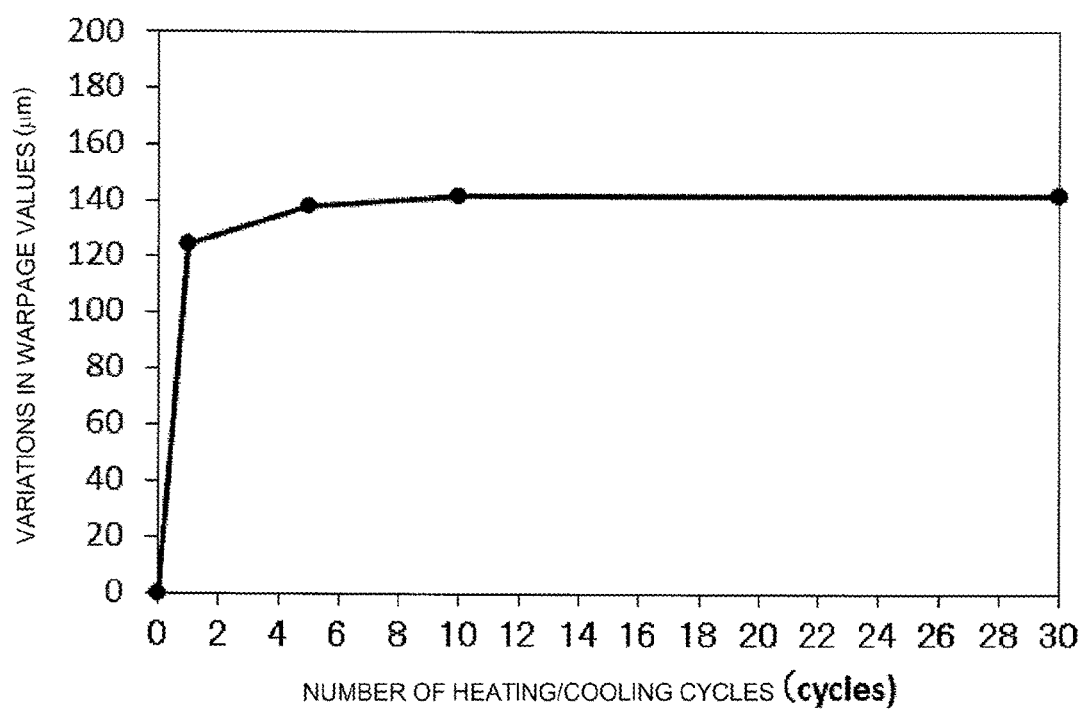
FIG. 14 is a diagram showing variations in the warpage values with respect to the number of heating/cooling cycles of a heating/cooling test on the semiconductor device according to the present invention.

In order to examine the stabilization of warpage by means of the heating/cooling process, a thermal cycle test that repeats a one-hour retention at −40° C. and a one-hour retention at 150° C. was performed on the sample prepared in Comparative Example 2. The results are shown in FIG. 14. Although the positive warpage was enhanced overall in the first cycle, the warpage did not change much in the subsequent cycles. Therefore, the variations of the warpage values of the metal plate 20 can be stabilized by performing at least one cycle of the heating/cooling process.

As a result of performing the heating process after the shot-peening process, not only is it possible to prevent partial warpage, but also the degree of warpage of the semiconductor device fixed to the cooler with bolts can be prevented from increasing upon activation of the semiconductor device, for the reason that the warpage of the metal plate 20 is stabilized. Consequently, changes in the distribution of the thermal grease upon activation of the semiconductor device can prevent a deterioration of heat dissipation uniformity.

REFERENCE SIGNS LIST

1 Cooler
2 Thermal grease
3 Metal plate
4 Insulating circuit board
4a, 4b, 4c, 4d, 4e, 4f Regions on rear surface of metal plate 3 where a plurality of insulating circuit boards 4 is arranged
5 Solder
6 Semiconductor chip
7 Insulating substrate
8 External terminal
9 Terminal case
10 Sealing resin
11 Surface work-hardened layer
12 Mask
13 First region
14 Second region
20 Metal plate
21 Insulating circuit board
25 Circuit portion
26 Metal portion
27 Shot material
28 Ultrasonic vibration device
30 Semiconductor device structure
31 Bonding wire
100 Semiconductor device

What is claimed is:
1. A semiconductor device, comprising:
a plurality of semiconductor elements;
a plurality of insulating circuit boards each including an insulating substrate, a circuit portion disposed on a front surface of the insulating substrate and connected to one of the plurality of semiconductor elements, and a metal portion disposed on a rear surface of the insulating substrate;

a metal plate having a dimension larger than that of the plurality of insulating circuit boards and joined to the metal portions of the plurality of insulating circuit boards; and a joint member joining the plurality of insulating circuit boards to the metal plate, wherein the metal plate has a front surface portion on which the plurality of insulating circuit boards is arranged apart from each other, and a rear surface portion having first regions formed at positions corresponding to the metal portions and second regions formed at positions other than the first regions, the rear surface portion of the metal plate includes surface work-hardened layers arranged apart from each other at the positions corresponding to the metal portions of the plurality of insulating circuit boards, each of the surface work-hardened layers entirely extending in each of the first regions and having a compressed surface layer in which residual stress is retained to curve the surface work-hardened layer into a convex curve, the first regions, the second regions, and the surface work-hardened layers are integrally formed in the metal plate as one metal plate member, and the second regions have a hardness different from that of the surface work-hardened layer.

2. The semiconductor device according to claim 1, wherein at least one of the surface work-hardened layers extends across the first regions.

3. The semiconductor device according to claim 2, wherein a direction in which said at least one of the surface work-hardened layers extends across the first regions is a direction in which the metal plate has a width shorter than that of another width thereof.

4. The semiconductor device according to claim 1, wherein the insulating substrate is made of aluminum oxide, aluminum nitride, or silicon nitride.

5. The semiconductor device according to claim 1, wherein the metal plate is a heat sink to cool the semiconductor element.

6. The semiconductor device according to claim 1, wherein the metal plate is entirely formed as the one metal plate member, and the surface work-hardened layers and the second regions have the hardness different from each other in the one metal plate member.

7. The semiconductor device according to claim 1, wherein each of the second regions is arranged between two of the first regions.

8. The semiconductor device according to claim 7, wherein each of the surface work-hardened layers has a shape and a size same as each of the first regions such that the surface work-hardened layers are arranged apart from each other through the second regions.

9. The semiconductor device according to claim 1, wherein the first regions are arranged only under the plurality of insulating circuit boards and divided through the second regions in the rear surface portion of the metal plate, and the surface work-hardened layers are arranged apart from each other in the first regions.

10. The semiconductor device according to claim 1, wherein the plurality of insulating circuit boards is arranged to be spaced apart from each other to form spaces therebetween, and the first regions are arranged to be spaced apart from each other to be located under the plurality of insulating circuit boards, and the second regions are located under the spaces between the plurality of insulating circuit boards.

11. A semiconductor device, comprising:

a plurality of semiconductor elements;

a plurality of insulating circuit boards each including an insulating substrate, a circuit portion disposed on a front surface of the insulating substrate and connected to one of the plurality of semiconductor elements, and a metal portion disposed on a rear surface of the insulating substrate;

a metal plate having a dimension larger than that of the plurality of insulating circuit boards and joined to the metal portions of the plurality of insulating circuit boards; and a joint member joining the plurality of insulating circuit boards to the metal plate, wherein the metal plate has a front surface portion on which the plurality of insulating circuit boards is arranged apart from each other, and a rear surface portion having first regions formed at positions corresponding to the metal portions and second regions formed at positions other than the first regions, the rear surface portion of the metal plate includes surface work-hardened layers arranged apart from each other at the positions corresponding to the metal portions of the plurality of insulating circuit boards, each of the surface work-hardened layers entirely extending in each of the first regions and having a compressed surface layer in which residual stress is retained to curve the surface work-hardened layer into a convex curve, the first regions, the second regions, and the surface work-hardened layers are integrally formed in the metal plate as one metal plate member, the second regions have a hardness different from that of the surface work-hardened layer, and an area of each of the surface work-hardened layers in each of the first regions is equal to an area of each of the first regions.

* * * * *

UNITED STATES PATENT AND TRADEMARK OFFICE
CERTIFICATE OF CORRECTION

PATENT NO. : 10,276,474 B2  
APPLICATION NO. : 15/091957  
DATED : April 30, 2019  
INVENTOR(S) : Takashi Saito et al.

Page 1 of 1

It is certified that error appears in the above-identified patent and that said Letters Patent is hereby corrected as shown below:

In the Specification

Please change Column 7, Line 39, from "the metal plate and ..." to --the metal plate 20 and ...--.

Signed and Sealed this  
Thirteenth Day of August, 2019

Andrei Iancu  
*Director of the United States Patent and Trademark Office*